US006388494B1

United States Patent
Kindt et al.

(10) Patent No.: US 6,388,494 B1
(45) Date of Patent: May 14, 2002

(54) OFFSET TRIM USING HOT-ELECTRON INDUCED $V_T$-SHIFTS

(75) Inventors: Willem Johannes Kindt, Sunnyvale, CA (US); Rudolphe Gustave Hubertus Eschauzier, Bergschenhoek; Arie van Rhijn, Kerkehout, both of (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/645,053

(22) Filed: Aug. 23, 2000

(51) Int. Cl.[7] .............................. H03K 17/14; H03F 3/45
(52) U.S. Cl. ........................ 327/307; 327/434; 330/258
(58) Field of Search ................................ 327/307, 379, 327/389, 427, 434; 330/258, 259

(56) References Cited

U.S. PATENT DOCUMENTS

| | | | | |
|---|---|---|---|---|
| 4,097,753 A | * | 6/1978 | Cook et al. ..................... 327/72 |
| 4,297,642 A | | 10/1981 | Baldwin et al. ................ 330/9 |
| 4,670,670 A | | 6/1987 | Shoji ........................... 327/543 |
| 4,858,195 A | * | 8/1989 | Soneda ......................... 327/50 |
| 5,557,234 A | * | 9/1996 | Collins ......................... 327/563 |
| 5,872,482 A | * | 2/1999 | Krauss ......................... 327/561 |
| 5,942,936 A | * | 8/1999 | Ricco et al. .................. 327/563 |
| 5,991,219 A | * | 11/1999 | Nakashima ............... 365/225.7 |

OTHER PUBLICATIONS

Sze, S.M., *Physics of Semiconductor Devices*, 2$^{nd}$ Ed., 1981, pp. 496–506.
Thornsen, A. et al., "A Floating–Gate MOSFET with Tunneling Injector Fabricated Using a Standard Double–Polysilicon CMOS Process"; *IEEE Electron Device Letters 12:3* (Mar. 1991), pp. 111–113.

* cited by examiner

Primary Examiner—Kenneth B. Wells
Assistant Examiner—Terry L. Englund
(74) Attorney, Agent, or Firm—Brett A. Hertzberg (57) ABSTRACT

A method and apparatus are provided for adjusting an offset in an electronic circuit by shifting at least one threshold voltage of a MOS transistor in an electronic circuit. By biasing a transistor into hard saturation, with sufficient supply voltage, charge carriers will be injected into the oxide layer of the MOS transistor over a predetermined time interval. Injection of charge carriers into the oxide layer of a MOS transistor causes the absolute value of the MOS transistor threshold voltage to increase. The injection of charge carriers is used to either intentionally increase or decrease the offset voltage in an electronic circuit due to mismatched components, process variations or to improve overall system accuracy or performance. In an operational amplifier or comparator, systematic offset voltage is measured at the output of the amplifier, and the threshold voltages of the differential input stage transistors are adjusted accordingly. In a digital to analog converter using precision current sources, the output voltage is measured for various code bits and the current levels for each current source are adjusted by shifting the threshold voltages as required. Offset voltage or mismatches in currents may be shifted in packaged electronic parts. The hot carrier injection method and apparatus, does not alter the temperature coefficient of the electronic part, requires minimal additional circuitry in electronic circuits, and greatly improves the precision with which electronic circuits may be manufactured.

20 Claims, 10 Drawing Sheets

OFFSET TRIM USING HOT-ELECTRON INDUCED $V_T$-SHIFTS

FIELD OF THE INVENTION

The present invention relates to a method and apparatus for adjusting an offset voltage in an electronic circuit. More specifically, the present invention provides for altering a threshold potential of a transistor to adjust the offset voltage of the electronic circuit.

BACKGROUND OF THE INVENTION

Typical microelectronic systems have various electronic components that require matched transistor devices for various performance characteristics. Examples of applications of matched transistors include: current mirrors and differential input circuits, which are commonly found in operational amplifiers, comparators and other analog electronic circuits.

Metal Oxide Semiconductor (MOS) transistors are commonly used for integrating entire electronic systems on a single microchip (chip). Because digital and analog systems often coexist on the same chip, the overall performance of analog MOS systems are not always optimal. Conventional semiconductor processes are often optimized for small geometry devices due to the overwhelming demand for digital electronics with higher densities and lower costs.

Digital electronics do not require the same type of parameter optimization, as that required in analog electronics. For example, the resistivity of polysilicon may vary widely in a digital system. Since polysilicon is predominately used to form the gates of transistors, and/or to interconnect the gates of transistors, the absolute resistance is only of incidental importance. However, in analog electronic circuits, the resistivity of polysilicon may be used to form a resistor for compensating an ampifier's stability (i.e. a simple resistor capacitor pair used to cancel a pole in the frequency response characteristic of the amplifier). The variations in the resistivity could cause that amplifier to oscillate in an unstable condition. Since digital semiconductor processes are not optimized for analog characteristics, analog circuit designs are limited in performance.

Comparators are commonly used in analog to digital converter circuit (ADC). In a typical ADC (not shown), a digital to analog converter (DAC) is digitally controlled to produce an analog reference voltage. The analog reference voltage is compared (by a comparator) to the analog input signal to determine when a successful conversion has been reached. A least significant bit (LSB) of resolution in an ADC is a function of the full-scale voltage ($V_{FS}$) and the number of bits of resolution (n) as given by $V_{LSB}=V_{FS}/2^N$. However, a non-ideal comparator has an inherent input offset voltage characteristic that changes over process variations. A high input offset voltage, if not compensated for, will cause the ADC to lose resolution. For example, an ADC with a 2V fill-scale voltage and 10 bits of resolution has an LSB equivalent to 1.953 mV. If the input offset voltage of the comparator exceeds the LSB criteria, then the comparator may not be able to discern an LSB of analog input signal.

SUMMARY OF THE INVENTION

In accordance with the invention, the above and other problems are solved by an apparatus for adjusting an offset between a first MOS transistor and a second MOS transistor. A measurer is employed to measure the offset between the MOS transistors; and a selector selects one of the MOS transistors based upon the measured offset. A threshold shifter increases the threshold voltage of the selected MOS transistor by injecting charge into its oxide layer so that the offset is optimized for use in an electronic circuit.

In accordance with other aspects of the invention, the offset between the first MOS transistor and the second MOS transistor represents at least a threshold voltage mismatch or a drain current mismatch. Also, a detector is used to determine when the electronic circuit is in a mode to adjust the offset and another mode for operating the electronic circuit.

In accordance with another embodiment of the invention, an apparatus adjusts an offset between a first MOS transistor and a second MOS transistor in an electronic circuit. A measurer is employed to measure an output of the electronic circuit; and an analyzer to determine the offset between the first MOS transistor and the second MOS transistor based on the measured output. A selector selects one of the MOS transistors based upon the offset. A threshold shifter increases the threshold voltage of the selected MOS transistor by injecting charge into its oxide layer so that a value of the offset between the first MOS transistor and the second MOS transistor is adjusted to another value that is optimized for use in an electronic circuit.

In accordance with other aspects of the invention, the electronic circuit is a differential amplifier with an output and a differential pair input stage. A gate of the first MOS transistor is a first input node and a gate of the second MOS transistor is a second input node for the differential pair input stage.

In accordance with still other aspects of the invention, a switching device is coupled to a drain of the selected MOS transistor when activated by the selector so that the selected MOS transistor is activated in hard saturation and hot charge carriers are injected into its oxide layer and the threshold voltage of the selected MOS transistor shifts.

In accordance with yet other aspects of the invention, the selector includes the differential pair so that a differential input voltage is applied between the first input node and the second input node to select one of the MOS transistors.

In accordance with still further aspects of the invention, the electronic circuit is a converter having a first current source that includes the first MOS transistor and a second current source that includes the second MOS transistor. A switching device is coupled to a current source that includes the selected MOS transistor when activated by the selector so that the selected MOS transistor is activated in hard saturation, hot change carriers are injected into its oxide layer and the threshold voltage of the selected transistor shifts. The selector controls the first current source with a first control bit and the second current source with a second control bit. The offset is determined by measuring an output of the converter and the converter can be a digital to analog converter.

In accordance with yet other aspects of the invention, the other value of the offset (after adjustment) can be less tan the value of the offset (before adjustment). Alternatively, when the electronic circuit is a comparator, the other value for the offset (after adjustment) can be greater than the value of the offset (before adjustment).

In accordance with another embodiment of the invention, a method for adjusting an offset in an electronic circuit by measuring a difference between a first threshold voltage for a first MOS transistor and a second threshold voltage for a second MOS transistor. The measured difference is employed to produce a measured offset that is compared to a tolerance value. The value of at least one of the first threshold voltage and the second threshold voltage is shifted based on the comparison of the measured offset to the tolerance value.

In accordance with other aspects of the invention, the threshold voltage of the first MOS transistor and the second MOS transistor are measured. The difference between the first threshold voltage and the second threshold voltage is determined and employed to produce the measured offset.

In accordance with still other aspects of the invention, one of the first MOS transistor and the second MOS transistor is elected based on the comparison of the measured offset to the tolerance value. The absolute drain to source voltage of the selected MOS transistor is adjusted so that the selected MOS transistor will be in hard saturation when active. The selected MOS transistor is activated over a time interval so that the selected MOS transistor will be placed in hard saturation, charge carriers will be injected into the oxide layer of the selected MOS transistor over the time interval and a threshold voltage of the selected MOS transistor is shifted to another value.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

As will become apparent from the discussion and figures that are described below, the present invention provides for: accurate trimming of transistor(s) $V_T$ using hot carriers, adjustment of overall offset voltage (increasing or reducing) by shifting transistor(s) $V_T$, minimal "on-chip" circuitry to effectuate trimming of offset and/or transistor(s) $V_T$, enabling the $V_T$ adjustment in a packed microchip, and no change in the temperature coefficient of the circuit due to trimming.

In accordance with the present invention, a threshold potential ($V_T$) of a MOS transistor is changed by injecting charge carriers into the gate oxide of the device. A large electric field is formed near the drain of the MOS transistor when the MOS transistor is operated with a high absolute drain to source voltage ($V_{DS}$). Charge carriers in the channel accelerate due to the high electric field. Over time, the electrons become "hot", and some of the carriers acquire sufficient energy to be injected into the gate oxide material located above the channel. The injected carriers create a fixed space charge in the oxide layer. Over time, sufficient carriers are injected into the oxide layer such that the threshold voltage ($V_T$) will shift. The shifted $V_T$ is used in operational amplifiers, comparators and the like to compensate for mismatches between matched transistors. A shifted $V_T$ may also be used to introduce intentional offsets into an electronic system for purposes such as removing systematic offset, or otherwise adjusting the input to output characteristics in the electronic system.

The present invention provides for the adjustment of a $V_T$ of both PMOS and NMOS transistors. In NMOS transistors, hot electrons are formed in the channel and electrons are injected into the gate-oxide layer. For PMOS transistors, hot holes are formed in the channel and positive charge is injected into the oxide layer. In either case, a charge is injected into the oxide layer and causes the $V_T$ to shift. The device (NMOS or PMOS) is biased active into "hard" saturation to create hot carriers (electrons or holes). The amount of charge which may be injected into the oxide layer is a function of several factors including: the absolute value of the $V_{DS}$, the current level while the device is active, and the length of time the device is active.

The $V_T$ of a MOS device is shifted by activating the MOS device over a fixed time interval (t) where the MOS transistor is biased into hard saturation. A higher absolute $V_{DS}$ will increase the probability ($P_{hot}$) of hot electrons (or holes) being present in the channel ($P_{hot}$ $V_{DS}$). The total amount of charge injected into the oxide layer is given by the probability ($P_{hot}$) of hot electrons (or holes) and the total number of carriers in the channel over the time interval. When a higher absolute $V_{DS}$ is used, a shorter time interval may provide the same charge injection as a lower $V_{DS}$ with a longer time interval (when the current is held constant). In adjusting the absolute $V_{DS}$, the voltages in an NMOS device should not exceed the highest potential on the chip, and the voltages in a PMOS device should not drop below the lowest potential on the chip. Caution must be exercised to prevent any voltages from exceeding the breakdown voltage for the device.

Figure 1:
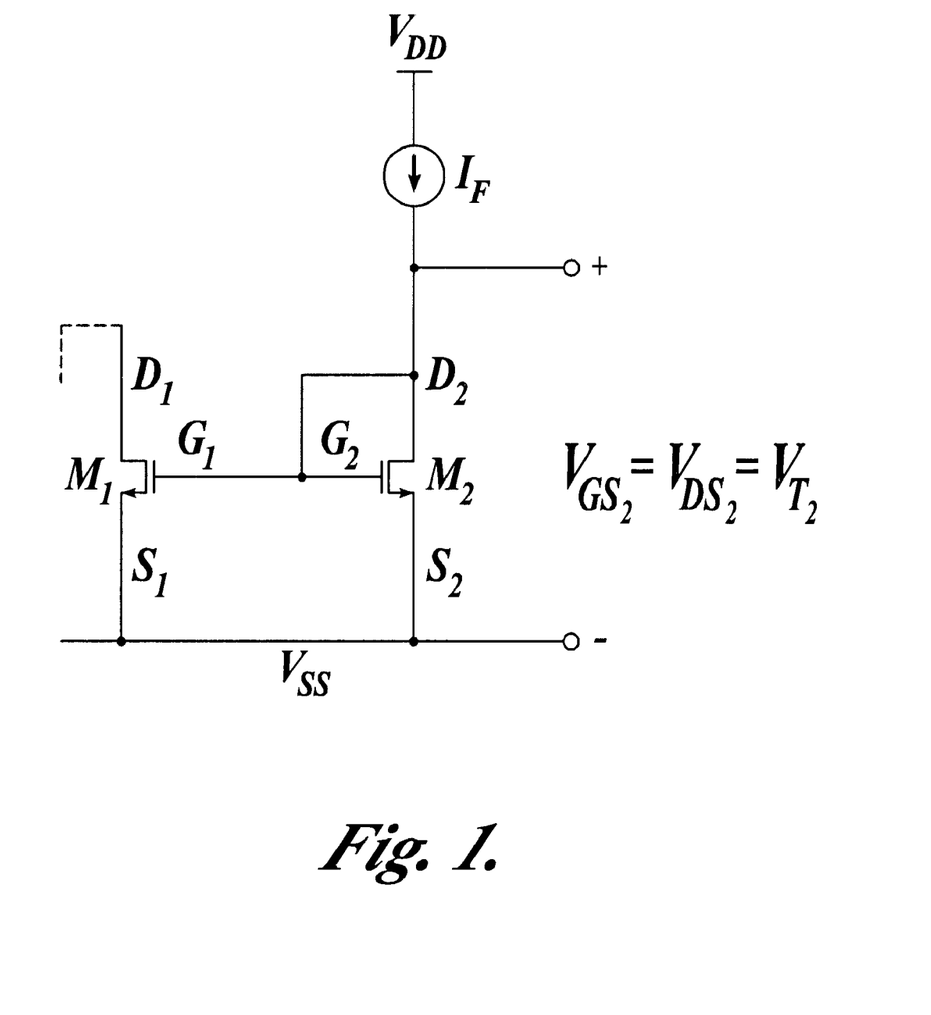
FIG. 1 shows an exemplary circuit for adjusting threshold voltages in accordance with the invention.

FIG. 1 depicts a circuit for adjusting the mismatch between threshold voltages in a matched transistor pair, in accordance with an aspect of the invention. A transistor pair ($M_1$, $M_2$) shares common gate and source connections. Transistor $M_2$ is configured as a diode connected device (gate and drain shorted together). Transistor $M_1$ is disabled while transistor $M_2$ is characterized. Different ways of disabling transistor $M_1$ may be employed. In the exemplary embodiment, the drain and source of transistor $M_1$ are shorted together to disable the device while transistor $M_2$ is characterized. $M_2$ is forward biased as a nominal operating current ($I_{NOM}$) is driven through device $M_2$. The forward bias voltage ($V_{T2}=V_{GS2}=V_{DS2}$) is measured while transistor $M_2$ is forward biased. Subsequently, the forward bias voltage of transistor $M_1$ ($V_{T1}=V_{GS1}=V_{DS1}$) is characterized at the same operating current as $M_2$ using the process described above.

Figure 2:
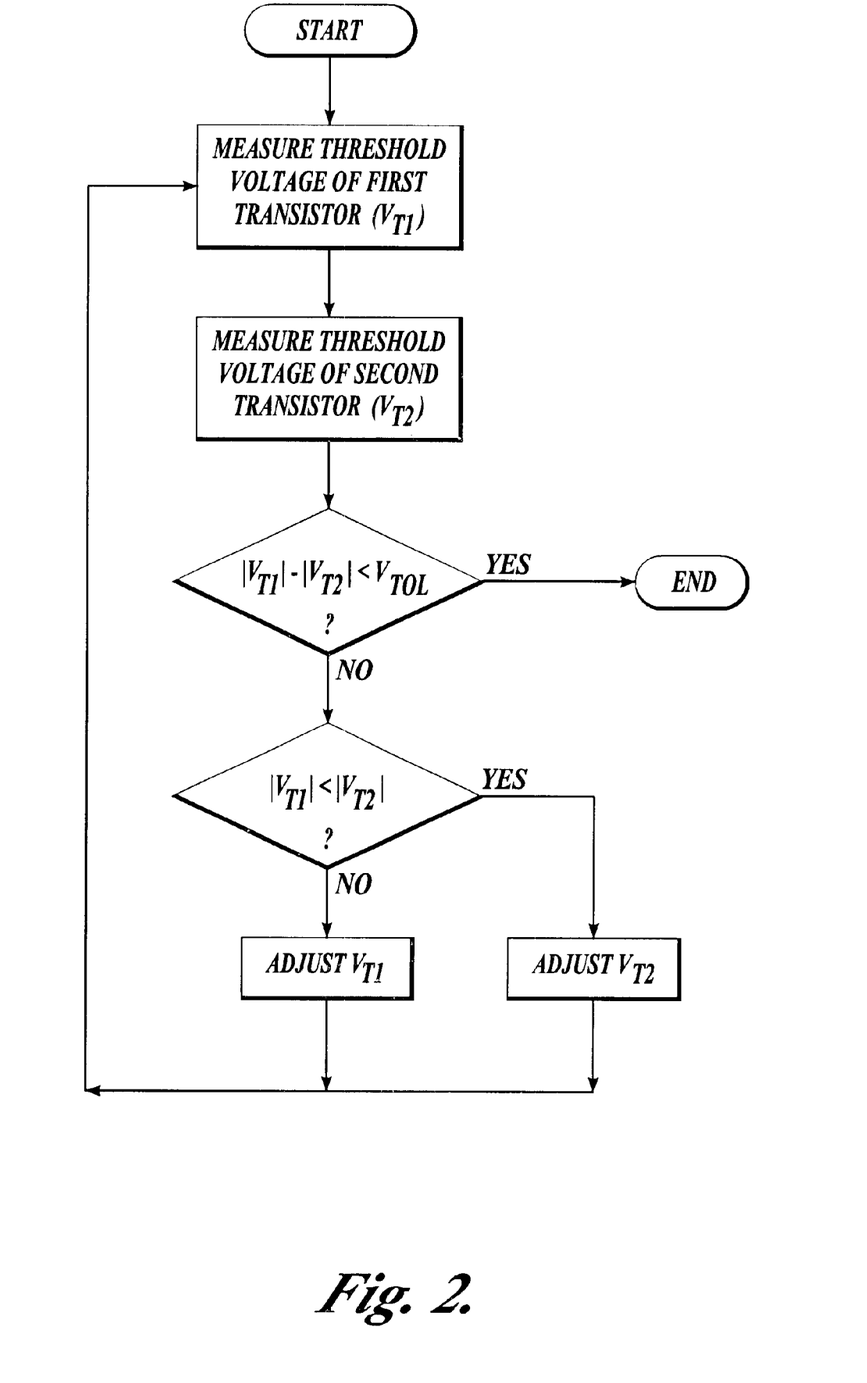
FIG. 2 illustrates a flow diagram for measuring and adjusting the threshold voltages of electronic devices.
Figure 3:
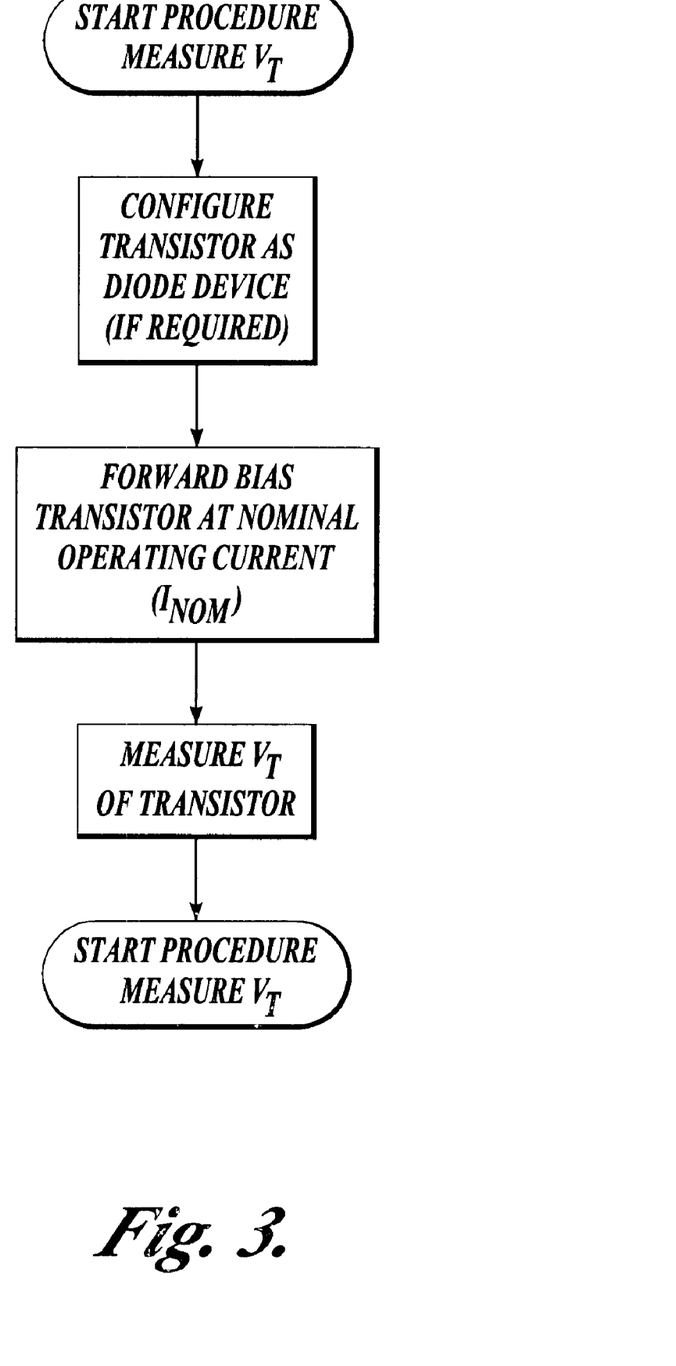
FIG. 3 shows a flow diagram for measuring the threshold voltage for an electronic device.
Figure 4:
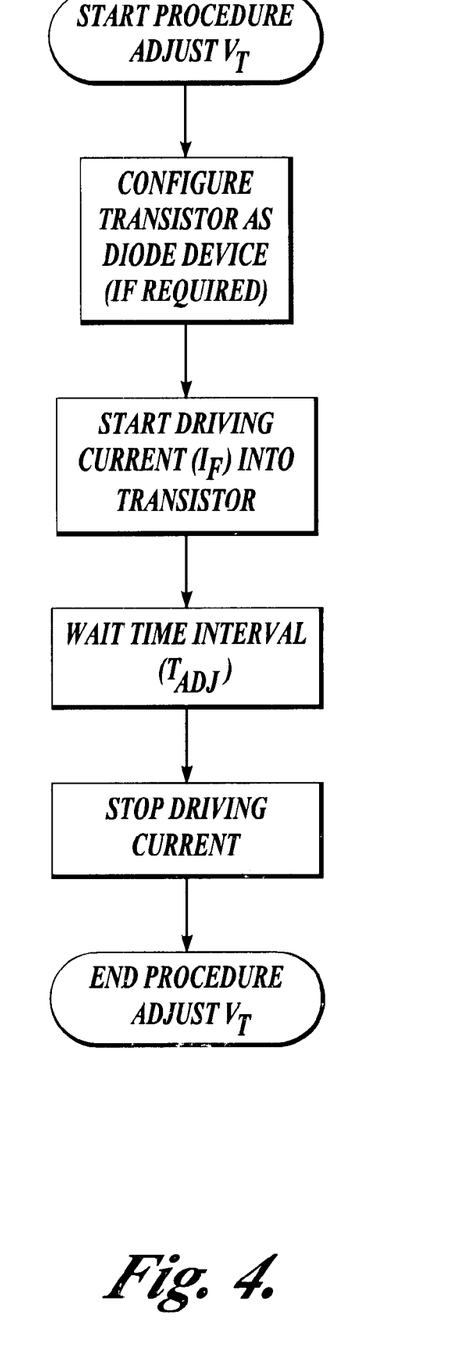
FIG. 4 illustrates a flow diagram for adjusting the threshold voltage for an electronic device.

FIGS. 2–4 illustrate a method for adjusting a mismatch between threshold voltages in a matched pair of transistors. The forward bias voltages ($V_{T1}$, $V_{T2}$) are compared to determine if they are within a minimum voltage tolerance level such as $|V_{T1}|-|V_{T2}|<V_{TOL}$. If they are not within the voltage tolerance, then the transistor with the lower absolute potential (i.e. $|V_{GS1}|<|V_{GS2}|$) is adjusted. The threshold potential ($V_T$) is adjusted by driving a drive current ($I_F$) through the device, sufficient for the device to be in hard saturation, for a given time interval ($T_{ADJ}$). The threshold potential is then measured again at the nominal current level ($I_{NOM}$) and the process is repeated until the devices match within the defined tolerance range ($V_{TOL}$). Although this process is described with two different current levels ($I_F$ and $I_{NOM}$), it is understood that the current levels may be the same.

As shown in FIG. 2, the characteristic forward bias voltages of the two transistors ($V_{T1}$, $V_{T2}$) are compared to determine if the transistors are matched within a tolerance voltage ($V_{TOL}$). As shown in FIG. 3, forward bias voltage can be measured by: configuring the transistor as a diode (shorting the gate to drain connection), driving a nominal current ($I_{NOM}$) into the drain of the transistor, and measuring the gate to source voltage ($V_{GS}=V_{DS}=V_T$).

During production of semiconductor circuits, it may not be possible to measure the threshold voltages of each device separately. In a preferred embodiment of the invention, transistor threshold adjustments are made to packaged electronic parts. Instead of measuring the individual transistor threshold voltages directly, an overall system measurement made outside of the packaged part may be necessary. Additionally, where individual measurements are not possible, differential measurements may be possible. Thus, the separate measurement steps shown in FIG. 2 may be combined such that the threshold voltages of the first and second transistor are measured in a single step as a difference between the threshold voltages (measurement =$|V_{T1}|-|V_{T2}|$)

Also shown in FIGS. 2 and 4, the transistor to be adjusted (the trim device) is forward biased with a drive current ($I_F$) over a fixed time interval ($T_{ADJ}$). The drive current ($I_F$) must be sufficient to cause the carriers (electrons or holes) in the conduction channel to become "hot", and thus charge will be injected into the oxide layer. The transistor should be biased into hard saturation (causing the channel to become pinched), a high voltage is present at the drain and a nominal voltage is applied to the gate, ensuring that charge is injected into the oxide layer. The amount of field strength at the drain will determine the probability that one electron (or hole) crossing the channel will be injected into the oxide layer. The probability for carriers to cross the channel is related to the current, which is more or less only controlled by the gate to source voltage, not by the drain potential (field strength at the drain). The current drive ($I_F$) and time interval ($T_{ADJ}$) may be adjusted together such that more current and less time results in roughly the same charge injection rate as less current and more time.

The drain current ($I_D$) of a MOS device is directly proportional to the total number of charge carriers (electrons or holes) present in the channel over the time interval ($I_D=Q/t$, where Q is total charge, and t is the length of the time interval). A higher current will increase the number of charge carriers (electrons or holes) present in the channel over the same time interval. When a MOS transistor is biased to produce hot electrons (or holes), an increased current will result in an increase in the number of charge carriers (electrons or holes) injected into the oxide layer over the same time interval.

Figure 5:
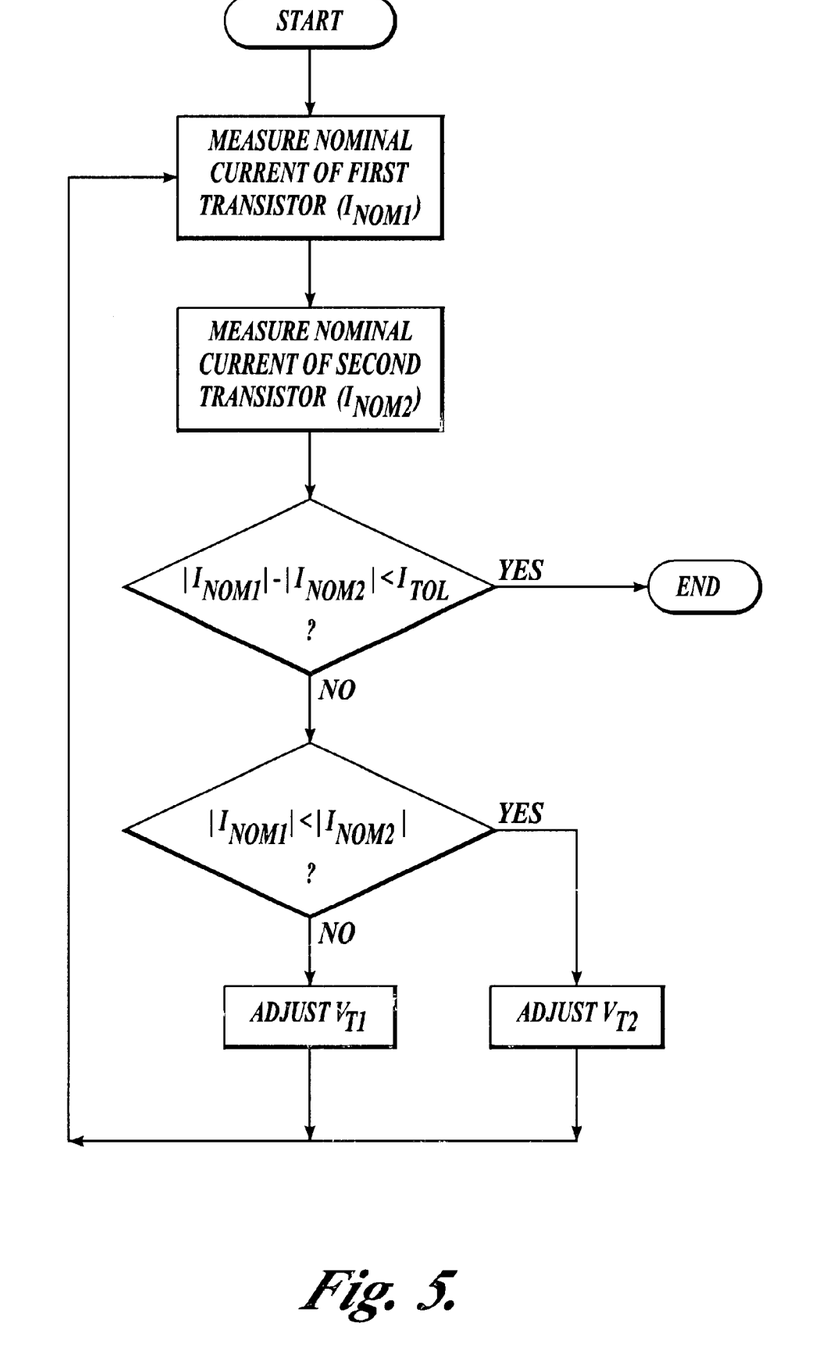
FIG. 5 shows another flow diagram for measuring and adjusting the threshold voltages of electronic devices.
Figure 6:
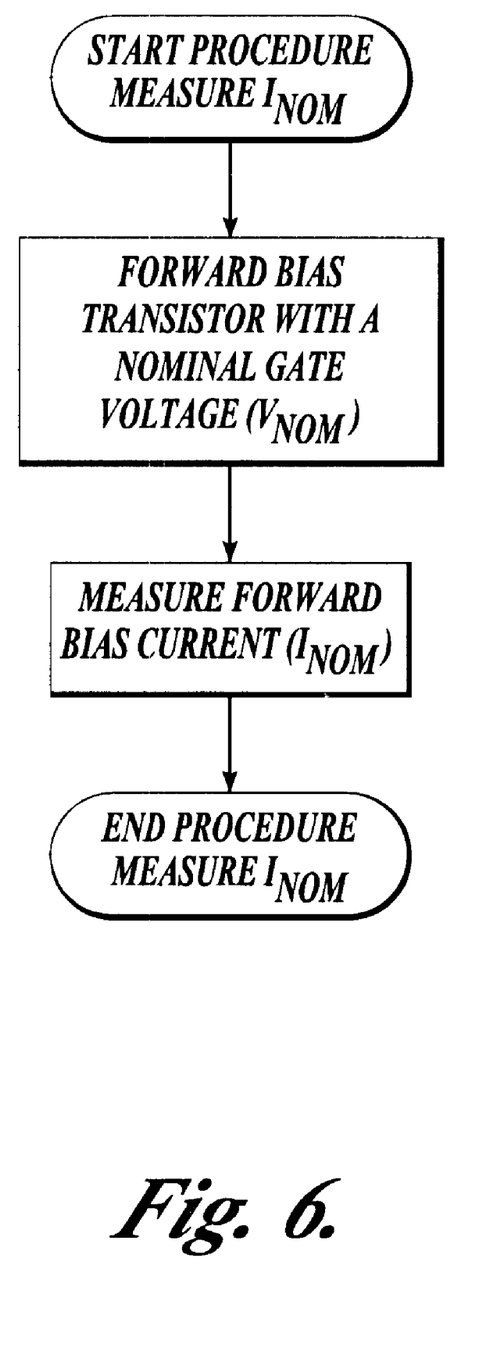
FIG. 6 illustrates a flow diagram for measuring a nominal operating current.

Another method for adjusting the threshold voltage is by measuring operating currents at a fixed gate drive as shown in FIGS. 5 and 6. In this embodiment, each transistor is characterized by coupling a fixed biasing voltage ($V_{NOM}$) to the gate of the device being tested. The operating current of the transistor ($I_{NOM}$) is measured while the transistor is biased. The operating currents of the two transistors are compared ($I_{NOM}1$, $I_{NOM}2$) to determine if they are within a minimum current tolerance level such as $|I_{NOM1}|-|I_{NOM2}|<I_{TOL}$. If they are not within the current tolerance, then the threshold voltage of the transistor with the higher current drive is adjusted (i.e. $|I_{NOM1}|<|I_{NOM2}|$, $V_{T2}$ is adjusted). The threshold voltage ($V_T$) is adjusted in a similar manner as that discussed previously, with the exception that the drive voltage at the gate is used to control the amount of current that is driven into the device.

Figure 7:
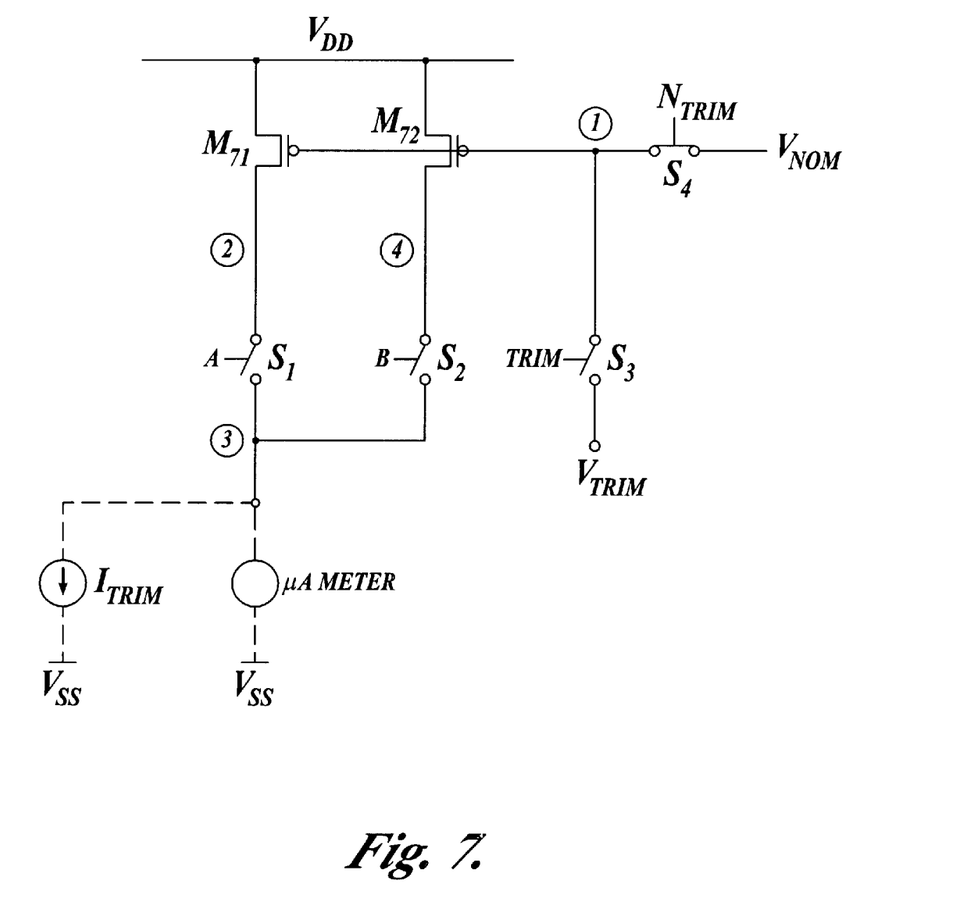
FIG. 7 shows another exemplary circuit for adjusting threshold voltages.

An exemplary circuit for implementing a current measurement method is shown in FIG. 7. Controlled switches are used to permit selection of individual transistors as well as measure and trim modes of operation Transistors $M_{71}$, and $M_{72}$ have common gate connections at node 1 and common source connections at VDD. A switch ($S_1$) is connected between nodes 2 and 3, and controlled by signal A. Another switch ($S_2$) is connected between nodes 4 and 3, and controlled by signal B. A trim voltage ($V_{TRIM}$) is connected to node 1 through switch $S_3$, which is controlled by signal TRIM. A bias voltage ($V_{NOM}$) is coupled to node 1 through switch $S_4$, which is controlled by signal NTRIM (the inverse of signal TRIM).

There are at least two operating modes for the exemplary circuit shown in FIG. 7, e.g., measurement mode and trim mode. The measurement mode is used to characterize the transistors. The trim mode is used to adjust the threshold of one of the transistors. The operating mode is controlled by the signal TRIM and NTRIM. When TRIM is active (trim mode), a voltage $V_{TRIM}$ is coupled to the gate of the transistors through switch $S_3$. When NTRIM is active (measurement mode), a voltage $V_{NOM}$ is coupled to the gate of the transistors through switch $S_4$. TRIM and NTRIM are not active at the same time ($S_3$ and $S_4$ are not closed at the same time).

During the measurement mode ($S_4$ closed, $S_3$ open), node 3 is coupled to $V_{SS}$ through a current measuring device. Switch $S_1$ is closed ($S_2$ open) when transistor $M_{71}$ is characterized. Switch $S_2$ is closed ($S_1$ open) when transistor $M_{72}$ is characterized. For Example, $V_{NOM}$ is coupled to the gate of $M_{71}$ and the drain current through transistor $M_{71}$ is measured as $I_{NOM1}$ ($S_1$, $S_4$: closed; $S_2$, $S_3$: open). $I_{NOM2}$ is measured similarly with $S_2$, $S_4$ closed and $S_1$, $S_3$ open. Although FIG. 7 shows $V_{SS}$ coupled to the drain of the transistors through the meter, any other desired potential can be coupled through the meter to node 3. It is preferred for the voltage coupled to node 3 through the meter to be a voltage suitable for the normal operating conditions of devices $M_{71}$ and $M_{72}$.

During the trim mode ($S_3$ closed, $S_4$ open), the gates of transistors $M_{71}$ and $M_{72}$ are coupled to trim voltage $V_{TRIM}$, and the normal bias voltage ($V_{NOM}$) is disconnected from the gates. Switches $S_1$ and $S_2$ select transistors $M_{71}$ and $M_{72}$ respectively for trim. After a device is selected, the selected transistor is forward biased by gate voltage $V_{TRIM}$. The selected device has a high absolute $V_{DS}$ because the drain is coupled through the meter to a low potential. Since the selected transistor is forward biased by $V_{TRIM}$ and has a high absolute $V_{DS}$, the transistor will be in hard saturtion. As discussed previously, a transistor in hard saturation has an increased probability of hot carriers (electrons or holes) in the channel being injected into the gate oxide. Current flows through the selected transistor over the required time interval, and the current through the meter is measured as $I_{TRIM}$. TABLE 7 below summarizes the various combinations of switches $S_1$, $S_2$, $S_3$ and $S_4$ and signals A and B.

TABLE 7

|       | A | B | Trim | Open/Closed |
|-------|---|---|------|-------------|
| $S_1$ | 0 | x | x    | open        |
|       | 1 | x | x    | closed      |
| $S_2$ | x | 0 | x    | open        |
|       | x | 1 | x    | closed      |
| $S_3$ | x | x | 0    | open        |
|       | x | x | 1    | closed      |
| $S_4$ | x | x | 0    | closed      |
|       | x | x | 1    | open        |

As shown in FIG. 7, a meter is coupled through node 3 to a supply voltage ($V_{SS}$) and node 1 is coupled to potential $V_{TRIM}$. Alternatively, node 1 may be shorted to node 3 during trim mode (diode connecting the selected device), and node 3 may be connected to a current source with a predetermined fixed current ($I_{TRIM}$).

The methods described above with reference to FIGS. 2–7 may be combined to facilitate implementation and desired performance. Although the methods described above are for two transistors, it is understood that substantially the same methods are applicable to an array of "N" number of devices. In addition, these methods maybe modified to introduce intentional mismatches between devices as may be desired.

Voltages and currents need not be measured directly with respect to individual transistors and may be determined through overall system performance. The overall system performance criteria will become apparent from the examples that follow below.

EXAMPLE 1

R2R Ladder Based DAC

Figure 8:
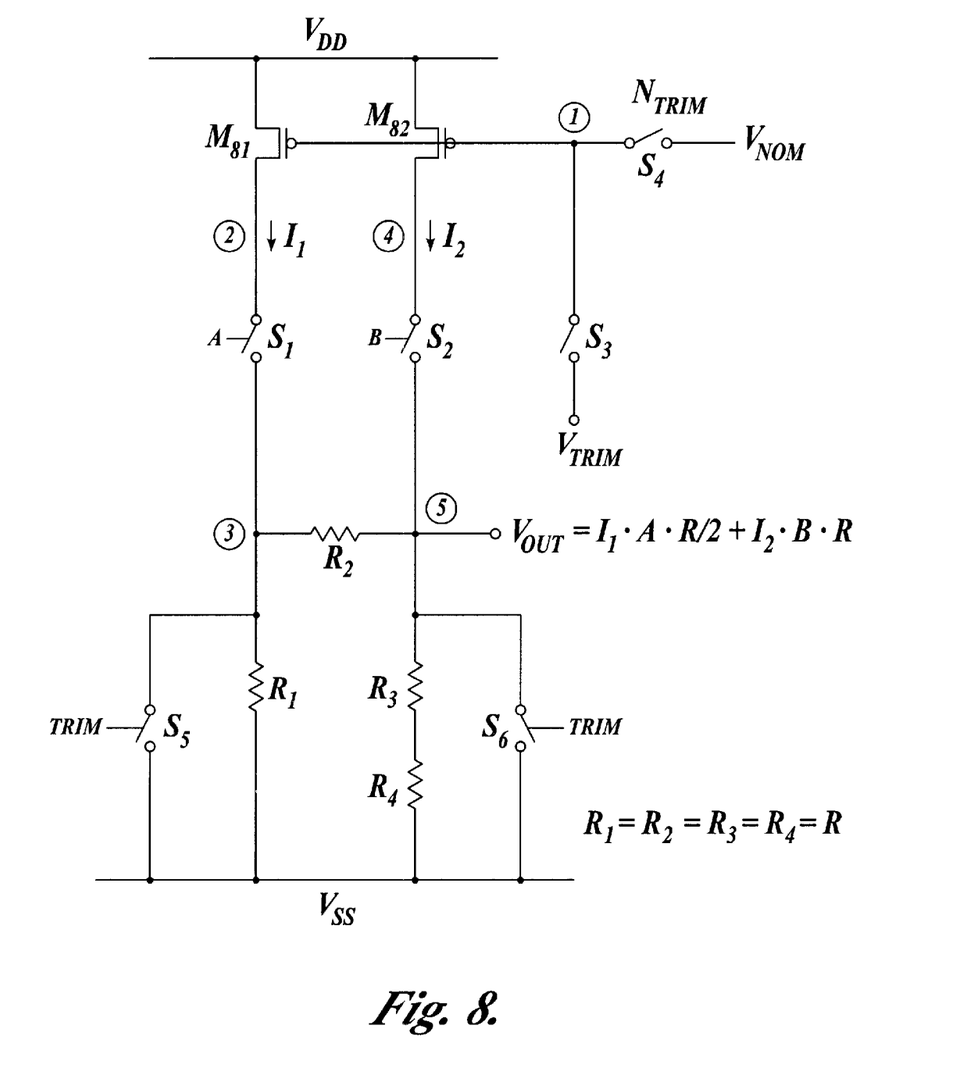
FIG. 8 illustrates another exemplary circuit for adjusting threshold voltages.

FIG. 8 shows a 2-bit R2R current ladder based DAC. Transistors $M_{81}$ and $M_{82}$ are a matched transistor pair with relatively identical currents ($I_{NOM}$) under a given biasing condition $V_{NOM}$). The transistors provide a controlled current source that feeds into the R2R circuit so that the output voltage of the DAC, under normal operation, is given by: $V_{OUT}$=I.R.(A/2)+B). In this exemplary embodiment, the current (I) is proportional to the full-scale voltage ($V_{FS}$) of the converter such that I=(2/3).($V_{FS}$/R). Thus, $V_{OUT}$=$V_{FS}$.(A+(2.B))/3, yielding voltages of 0, (1/3)$V_{FS}$, (2/3) $V_{FS}$, and $V_{FS}$.

$M_{81}$ and $M_{82}$ have common gate connections at node 1 and common source connections at VDD. $V_{NOM}$ is coupled to node 1 through switch $S_4$, which is closed when signal NTRIM is active. A trim bias voltage ($V_{TRIM}$) is coupled to node 1 through switch $S_3$, which is closed when signal TRIM is active (NTRIM is inactive when TRIM is active). The drain of $M_{81}$ is coupled to node 2. Node 2 is coupled to node 3 though normally open switch $S_1$, which is activated by signal A. The drain of $M_{82}$ is coupled to node 4. Node 4 is coupled to node 5 through normally open switch $S_2$, which is activated by signal B. The R2R ladder has four resistors ($R_1$–$R_4$), each of equal value (R). $R_1$ is connected between node 3 and VSS. $R_2$ is connected between node 3 and node 5. $R_3$ and $R_4$ are series connected between node 5 and VSS. Switch $S_5$ shorts node 3 to VSS when active. Switch $S_6$ shorts node 5 to VSS when active. Both switches $S_5$ and $S_6$ are activated by signal TRIM. The output voltage ($V_{OUT}$) of the DAC is measured at node 5.

The DAC is in a normal operating mode when TRIM is inactive (TRIM=0) and NTRIM is active (NTRIM=1). During the normal operating mode, $V_{OUT}$ is measured for at least two settings: A=1, B=0 ($V_{OUT1}$); and A=0, B=1 ($V_{OUT2}$). $V_{OUT1}$ should ideally be half of $V_{OUT2}$. If the voltages are not accurate, ten either the resistor values for $R_1$–$R_4$ do not accurately match, or the currents $I_1$ and $I_2$ do not match exactly. When $V_{OUT1}$ is less than half of $V_{OUT2}$, decreasing the current drive of $M_{82}$ will correct for an overall error in the DAC. Increasing the threshold voltage of $M_{82}$ will result in decreasing the current drive of $M_{82}$.

A method for adjusting the offset voltage for the DAC shown in FIG. 8 is as follows. First, switches $S_1$ and $S_2$ are opened to prevent transistors $M_{81}$ and $M_{82}$ from conducting, Second, TRIM is set active (closing switches $S_3$, $S_5$ and $S_0$, and opening switch $S_4$), which causes nodes 3 and 5 to be coupled to VSS. Third, $S_2$ is closed, which causes transistor $M_{82}$ to drive into hard saturation since $V_{TRIM}$ is coupled to node 1. After a predetermined time interval ($T_{ADJ}$), switch $S_2$ is opened which stops the trimming. While $M_{82}$ was active, hot holes appeared in the channel and positive charge was injected into the oxide layer of $M_{82}$, resulting in a shift in the threshold voltage of $M_{82}$.

If $V_{OUT1}$ is greater than half of $V_{OUT2}$, decreasing the current drive of $M_{81}$ will correct for overall error in the DAC. The procedure for trimming $M_{81}$ is substantially similar to that for $M_{82}$ described above, except that $S_1$ is activated and deactivated instead of $S_2$. This process is repeated until the desired output voltages are within an acceptable tolerance range.

Although this exemplary embodiment includes a 2-bit DAC, the methodology can be adapted for use in an "N" bit DAC. One advantage to trimming a DAC in this manner is that very little additional circuitry is required "on-chip" to perform trimming. The trimming may also be performed in a packaged device.

EXAMPLE 2

Operational-amplifier

Figure 9:
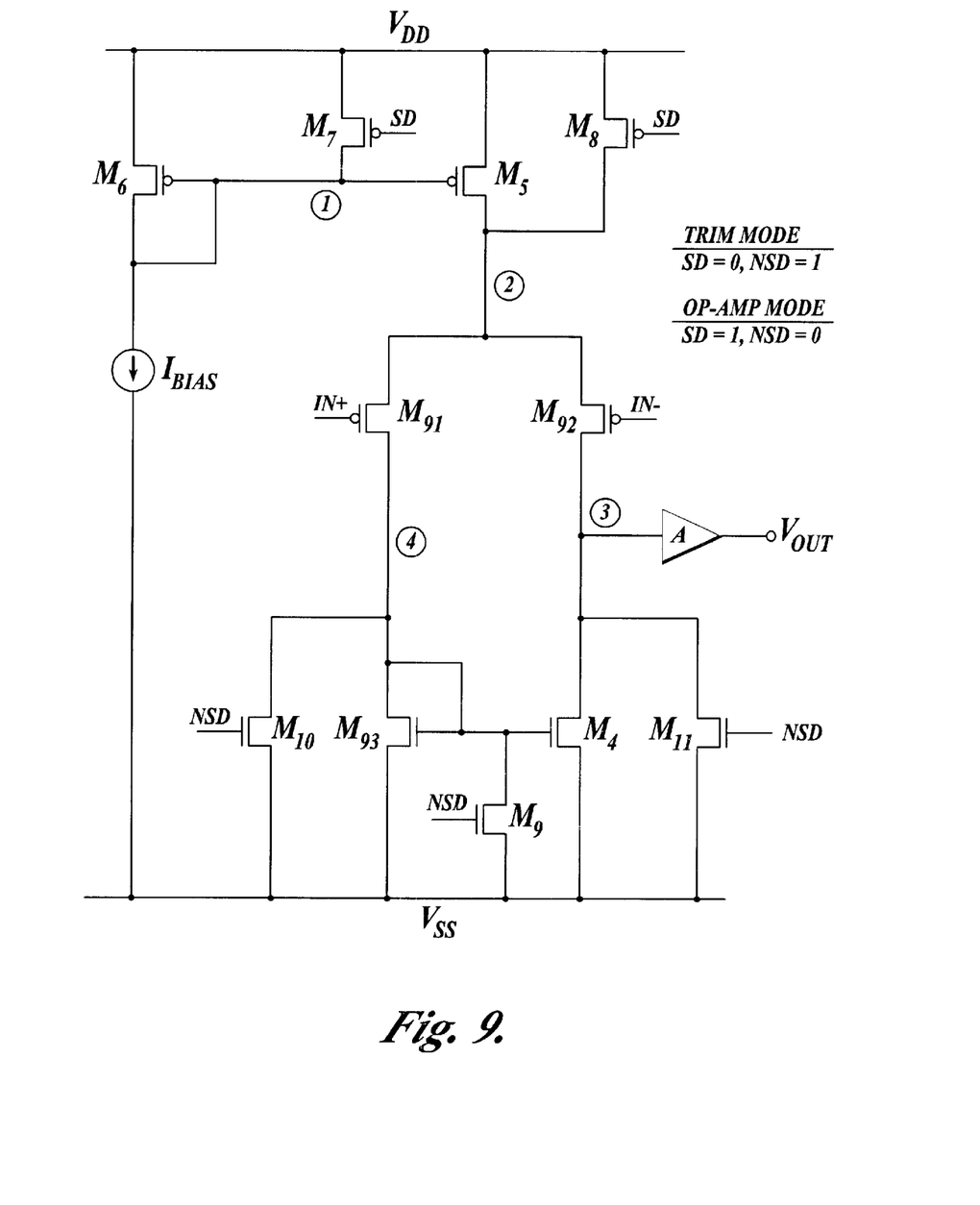
FIG. 9 shows another exemplary circuit for adjusting threshold voltages.

In FIG. 9, an operational amplifier (op-amp) circuit is shown that is designed for offset calibration with the invention. The operational amplifier supports a normal mode of operation and a trim mode for adjusting the offset of the amplifier. Shut down control signals SD and NSD are used to place the operational amplifier into the trim mode. Under normal operation, SD is logic "1" (VDD) and NSD is logic "0" (VSS). During the trimming operation, SD is logic "0" and NSD is logic "1".

The operational amplifier has a differential input stage formed by transistors $M_{91}$ and $M_{92}$. Transistors $M_{91}$ and $M_{92}$ have a common source connection at node 2. The gate of $M_{91}$ is the non-inverting input (IN+) of the op-amp, while the gate of $M_{92}$ is the inverting input (IN−). Transistors $M_{93}$ and $M_4$ from a current mirror, with common gate connections at node 4 and common source connections to VSS. The drain of $M_{93}$ is connected to the drain of $M_{91}$ at node 4. The drain of $M_4$ is connected to the drain of $M_{92}$ at node 3. Transistor $M_5$ forms a current source with a gate connected to node 1, a drain connected to node 2 and a source connected to VDD. The source of transistor $M_6$ is connected to VDD, while the drain and gate of transistor $M_6$ are connected to node 1, forming a diode. $I_{BIAS}$ is series connected between node 1 and VSS to set up the biasing current of the op-amp. Node 3 is fed into amplifier stage A, which drives the output $V_{OUT}$.

Transistors $M_7$–$M_{11}$, are disabled during normal operation. Transistor $M_7$ has a source connected to VDD, a drain connected to node 1, and a gate connected to signal SD. Transistor $M_8$ has a source connected to VDD, a drain connected to node 2, and a gate connected to signal SD.

Transistor $M_9$ has a source connected to VSS, a drain connected to node 4 and a gate connected to signal NSD. Transistor $M_{10}$ has a source connected to VSS, a drain connected to node 4 and a gate connected to signal NSD. Transistor $M_{11}$ has a source connected to VSS, a drain connected to node 3, and a gate connected to signal NSD.

Transistor pair $M_{91}$ and $M_{92}$ and another transistor pair $M_{93}$ and $M_4$ are ideally matched such that their $V_T$ and their conductive characteristics match closely. Due to process variations and other non-ideal effects, these transistors are not quite identical. In addition, the output amplifier stage A ideally does not introduce any offset into the system. A typical op-amp configuration that is useful in measuring offset voltage is a voltage follower configuration (not shown). By coupling the output ($V_{OUT}$) to the inverting input (IN−), and driving a input signal ($V_i$) into the non-inverting input (IN+) the op-amp it configured as a voltage follower.

The offset voltage of the op-amp is measured according to any method available. The output voltage of a non-ideal op-amp can be characterized as follows: $V_{out} = A \cdot (IN+ - IN- + V_{os})$, where A is the gain of the amplifier and $V_{os}$ is the input referred offset voltage. When the operational amplifier is configured as a voltage follower (not shown) IN− is shorted to $V_{out}$, and IN+ is connected to a voltage source ($V_{in}$). The equation for the output voltage is given by $V_{out} = A \cdot (V_{in} - V_{out} + V_{os})$. Since A is a large value in operational amplifiers, the offset voltage can be determined as $V_{os} = V_{out} - V_{in}$. Thus, by comparing the input voltage to the output voltage we can determine the input offset voltage of the operational amplifier.

A method for adjusting the offset voltage for the op-amp shown in FIG. 9 is as follows. First, the op-amp is set in its normal operating mode and the offset of the op-amp is measured with a voltage follower configuration. After measuring the offset, the sign of the offset is analyzed to determine which transistor is to be trimmed. For the non-inverting buffer (voltage follower configuration), a positive sign to the offset voltage indicates that the threshold voltage of the inverting input terminal transistor ($M_{92}$) should be increased. Second, the op-amp is set in an open loop mode ($V_{OUT}$ floating), one input is shorted to VSS and the other input is shorted to VDD (i.e. IN+=VDD or IN−=VDD). Third, the op-amp is set into a trim mode by setting SD to logic "0" and NSD to logic "1". During a defined wait/time interval ($T_{ADJ}$), charge is injected into the oxide layer. Lastly, the op-amp is set back to a normal mode (SD=1, NSD=0) and the resulting offset is measured. The method is repeated until the desired offset is achieved.

During the trimming operation, SD is set to logic "0" and NSD is set to logic "1". When the trimming mode is activated, the normal biasing currents are disabled. Transistors $M_7$ and $M_9$ are activated by SD and NSD respectively. Transistor $M_7$ disables current source $M_5$ by pulling its gate voltage (node 1) to $V_{DD}$. Similarly, transistor $M_9$ disables current mirror devices $M_3$ and $M_4$ by pulling their common gates (node 4) to $V_{SS}$.

A large current is driven through the transistor that is being trimmed. Transistor $M_8$ drives a large current into the common point (node 2) of the differential pair. When $M_{92}$ is to be trimmed, IN+ is coupled to a high voltage and IN− is coupled to a low voltage causing $M_{92}$ to turn on, and $M_{91}$ to shut down. When $M_{91}$ is to be trimmed, IN+ is coupled to a low voltage and IN− is coupled to a high voltage causing $M_{91}$ to turn on and $M_{92}$ to shut down. $M_{10}$ provides a conduction path for $M_{91}$ from $V_{DD}$ to $V_{SS}$. Similarly, $M_{11}$ provides a conduction path for $M_{92}$ from $V_{DD}$ to $V_{SS}$.

During the trimming operation, a current is driven through the transistor device for a time interval that is dependant upon the semiconductor process characteristics (e.g. 50 milliseconds). The high and low voltages driven at IN+ and IN− are appropriate voltages to activate the device to be trimmed in saturation and to disable the device that is not being trimmed. (In practice, for a PMOS differential pair, the gate of the trim device will be tied to VDD−$V_T$, and the gate of the non-trim device will be tied to VDD.) However, during the trimming operation, the supply voltage will be adjusted such that $V_{DD}$ is high enough to cause hot electrons (or holes) to occur. Higher than normal operating voltages are required to cause hot electrons (or holes) to occur. However, caution must be exercised to prevent damage to the transistors and the breakdown voltage of the process must not be exceeded. It is understood and appreciated that based upon the process geometries and other characteristics, the operating and trim voltages will vary. After the trimming time interval, the offset of the amplifier is measured again. The procedure discussed above may be repeated until a desired performance is achieved (either sufficiently low offset, within a desired range, or sufficiently high offset).

In a production environment, it is envisioned that the trimming time and trimming current may be adjusted on a part-by-part basis after the initial offset voltage (or current) is measured. For example, if a part has an initial offset voltage of 10 mV, we may choose a trimming time of 10 ms (if we had previously determined that the offset changes by 1 mV/ms). After trimming, we may measure another offset of 1 mV, and thus we only require one additional millisecond of trimming. In another example, we may find that an initial offset of −50 mV is trimmed for 50 ms resulting in a new offset of +2 mV. We then trim the other transistor for 2 ms to converge on an appropriate offset voltage. By varying the trimming time, and/or the trimming current, we can converge on solution with greater accuracy and reduce calibration time. An algorithmic approach to trimming, based on the measured offset, will result in faster trimming procedures during production.

Figure 10:
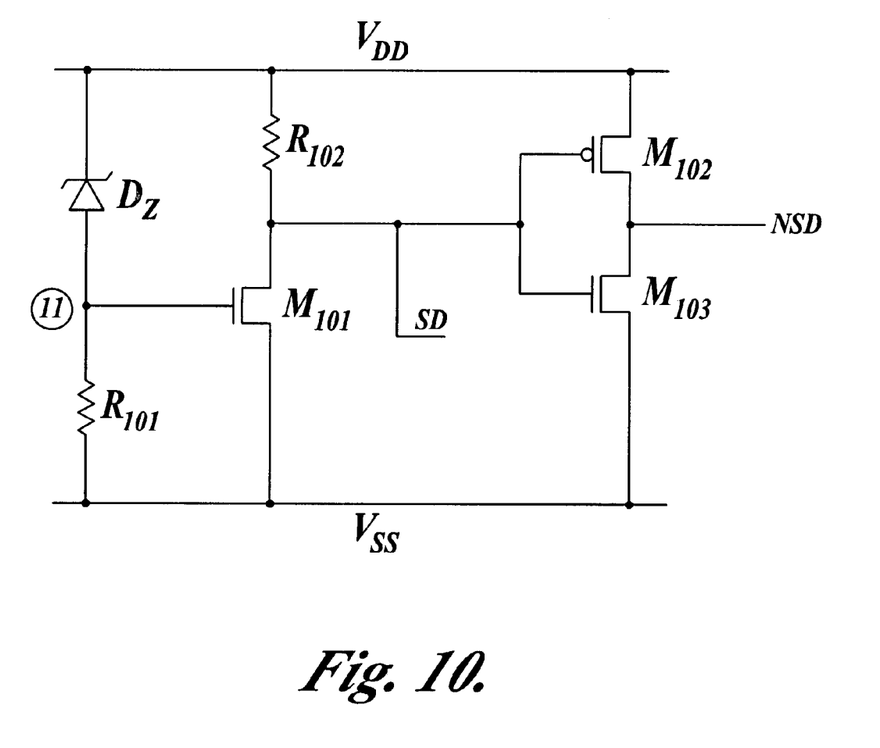
FIG. 10 illustrates an exemplary control logic circuit in accordance with the invention.

A circuit that is useful for generating the logic signals SD and NSD is shown in FIG. 10. This circuit is formed on the same chip as the op-amp shown in FIG. 9. Since the circuit operates by detecting the power supply voltages exceeding normal operating ranges, the logic circuit does not require any pin in the packaged part. A zener diode is connected between VDD and node 11. Although a zener diode is shown in the figure, any clamping device that suitably detects trim mode (such as an ESD clamping device) may be used. The zener voltage shown in the figure is on the order of 6.8V. A resistor ($R_{101}$) is coupled between node 11 and VSS. A transistor $M_{101}$ has a gate connected to node 11, a source connected to VSS and a drain connected to node SD. $R_{101}$ has a suitably low value to permit transistor $M_{101}$ to become active when the power supply is above normal operating modes and below the breakdown voltage for the process. A second resistor ($R_{102}$) is series connected between VDD and SD such that $M_{101}$ and $R_{102}$ found an inverter. $R_{102}$ is a pull-up resistor of a sufficient value to form a logic inverter. Transistor $M_{102}$ has a gate connected to SD, a drain connected to NSD and a source connected to VDD. Transistor $M_{103}$ has a gate connected to SD, a drain connected to NSD and a source connected to VSS. Transistors $M_{102}$ and $M_{103}$ form an inverter.

When the circuit shown in FIG. 10 is designed on the same microchip as the op-amp in FIG. 9, no additional pins are necessary to activate the trim mode. Thus, a fully packaged part may be trimmed according to this method.

Since the zener diode conducts when the chip potential (VDD, VSS) exceeds the zener voltage, the circuit in FIG. 10 does not interfere with normal operating voltages (VDD=5V, VSS=0V) of the op-amp. However, once the supply voltage is raised up sufficiently high to activate transistor $M_{101}$, the control signals SD and NSD are placed in trim mode. Thus, no test pins are required and a standard op-amp package may be employed while retaining the increased ability to trim offset voltage.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A method for adjusting an offset in an electronic circuit, comprising:
   (a) measuring a difference between a first threshold voltage for a first MOS transistor and a second threshold voltage for a second MOS transistor, employing the difference to produce a measured offset, wherein each of the first MOS transistor and the second MOS transistor has a single gate structure;
   (b) comparing the measured offset to a tolerance value; and
   (c) shifting the value of at least one of the first threshold voltage and the second threshold voltage based on the comparison of the measured offset to the tolerance value.

2. The method in claim 1, wherein measuring the difference includes:
   (a) measuring the first threshold voltage of the first MOS transistor;
   (b) measuring the second threshold voltage of the second MOS transistor; and
   (c) determining the difference between the first threshold voltage and the second threshold voltage to produce the measured offset.

3. The method in claim 1, wherein shifting includes:
   (a) selecting one of the first MOS transistor and the second MOS transistor in response to comparing the measured offset to the tolerance value;
   (b) adjusting the absolute drain to source voltage of the selected MOS transistor such that the selected MOS transistor will be in hard saturation when active; and
   (c) activating the selected MOS transistor over a time interval such that the selected MOS transistor will be in hard saturation, and charge carriers are injected into the oxide layer of the selected MOS transistor over the interval, whereby the threshold voltage of the selected MOS transistor is shifted to another value.

4. The method of claim 1, further comprising determining when the electronic circuit is in a mode to adjust the offset and another mode for operating the electronic circuit.

5. An apparatus that is enabled to adjust offset between a first MOS transistor and a second MOS transistor, comprising:
   (a) a measurer that measures the offset between the first MOS transistor and the second MOS transistor;
   (b) a selector that selects one of the first MOS transistor and the second MOS transistor based upon the offset; and
   (c) a threshold shifter that increases the threshold voltage of the selected MOS transistor by injecting charge into its oxide layer, whereby a value of the offset between the first MOS transistor and the second MOS transistor is adjusted to another value that is optimized for use in an electronic circuit.

6. The apparatus of claim 5, wherein the offset between the first MOS transistor and the second MOS transistor represents at least one of a threshold voltage mismatch and a drain current mismatch.

7. The apparatus of claim 5, further comprising a detector that determines when the electronic circuit is in a mode to adjust the offset and another mode for operating the electronic circuit.

8. An apparatus that is enabled to adjust an offset between a first MOS transistor and a second MOS transistor in an electronic circuit, comprising:
   (a) a measurer that measures an output of the electronic circuit;
   (b) an analyzer that determines the offset between the first MOS transistor and the second MOS transistor based on the measured output;
   (c) a selector that selects one of the first MOS transistor and the second MOS transistor based upon the offset; and
   (d) a threshold shifter that increases the threshold voltage of the selected MOS transistor by injecting charge into its oxide layer, whereby a value of the offset between the first MOS transistor and the second MOS transistor is adjusted to another value that is optimized for use in the electronic circuit.

9. The apparatus of claim 8, wherein the electronic circuit is a differential amplifier having an output and a differential pair input stage, a gate of first MOS transistor is a first input node in the differential pair input stage and a gate of the second MOS transistor is a second input node in the differential pair input stage.

10. The apparatus of claim 8, further comprising a detector that determines when the electronic circuit is in a mode to adjust the offset and another mode for operating the electronic circuit.

11. The apparatus of claim 8, further comprising a switching device that is coupled to a drain of the selected MOS transistor when activated, the selector activating the switching device such that the selected MOS transistor is activated in hard saturation and hot charge carriers are injected into its oxide layer and the threshold voltage of the selected MOS transistor shifts.

12. The apparatus of claim 8, wherein the selector includes a differential pair input stage such that a differential input voltage is applied between a first input node and a second input node to select one of the first MOS transistor and the second MOS transistor.

13. The apparatus of claim 8, wherein the electronic circuit is a converter having a first current source that includes the first MOS transistor and a second current source that includes the second MOS transistor.

14. The apparatus of claim 13, further comprising a switching device that is coupled to a current source that includes the selected MOS transistor when activated, the selector activating the switching device such that the selected MOS transistor is activated in hard saturation and hot charge carriers are injected into its oxide layer and the threshold voltage of the selected transistor shifts.

15. The apparatus of claim 13, wherein the selector controls the first current source with a first control bit and the second current source with a second control bit.

16. The apparatus of claim 13, wherein the offset is determined by measuring an output of the converter.

17. The apparatus of claim 13, wherein the converter is a digital to analog converter.

18. The apparatus of claim 8, wherein the other value of the offset is less than the value of the offset.

19. The apparatus of claim 10, wherein the other value for the offset is greater than the value of the offset when the electronic circuit is a comparator.

20. An apparatus that is enabled to adjust an offset between a first MOS transistor and a second MOS transistor in an electronic circuit, comprising:

(a) means for measuring an output of the electronic circuit;

(b) means for determining the offset between the first MOS transistor and the second MOS transistor based on the measured output;

(c) means for selecting one of the first MOS transistor and the second MOS transistor based upon the offset; and (d) means for increasing the threshold voltage of the selected MOS transistor by injecting charge into its oxide layer, whereby the offset between the first MOS transistor and the second MOS transistor is adjusted to another value that is optimized for use in the electronic circuit.

* * * * *